(12) United States Patent
Plangger et al.

(10) Patent No.: US 7,504,846 B2
(45) Date of Patent: Mar. 17, 2009

(54) TESTABLE CASCODE CIRCUIT AND METHOD FOR TESTING THE SAME USING A GROUP OF SWITCHING ELEMENTS

(75) Inventors: Guido Plangger, Eschenbach (CH); Meike Pingel, Zürich (CH); Joachim C. Reiner, Kilchberg (CH)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/509,863

(22) PCT Filed: Mar. 31, 2003

(86) PCT No.: PCT/IB03/01162
§ 371 (c)(1),
(2), (4) Date: Jun. 10, 2005

(87) PCT Pub. No.: WO03/083496
PCT Pub. Date: Oct. 9, 2003

(65) Prior Publication Data
US 2006/0232289 A1 Oct. 19, 2006

(30) Foreign Application Priority Data
Apr. 2, 2002 (EP) ................................ 02007493

(51) Int. Cl.
G01R 31/02 (2006.01)

(52) U.S. Cl. ..................... 324/763; 324/158.1; 324/765

(58) Field of Classification Search ............. 324/158.1, 324/763–765; 714/724, 733
See application file for complete search history.

(56) References Cited

U.S. PATENT DOCUMENTS

| 4,656,417 | A | * | 4/1987 | Kirkpatrick et al. ........... 326/16 |
| 5,942,922 | A | * | 8/1999 | Dinteman et al. ............ 327/108 |
| 5,995,010 | A |   | 11/1999 | Blake et al. |
| 6,211,693 | B1 | * | 4/2001 | Andresen et al. ............ 324/769 |

* cited by examiner

*Primary Examiner*—Vinh P Nguyen
(74) *Attorney, Agent, or Firm*—Peter Zawilski

(57) ABSTRACT

The cascode circuit comprises a plurality of switching transistors (11) to be protected from high voltage and a plurality of cascode transistors (13) connected to the switching transistors (11). A test node (B') is arranged between each switching transistors (11) and its cascode transistor (13), and a test transistor (30.1-30.n) is allocated to each test node (B'), its gate being connected to the test node (B'). The sources of the test transistors (30.1-30.n) are connected to a first test point (31) and the drains of the test transistors (30.1-30.n) are connected to a second test point (32). A first voltage (U1) is applied to the first test point (31) and a second, slightly lower voltage (U2) is applied to the second test point (32). A current flow detected between the first (31) and the second (32) test point indicates that at least one of the cascode transistors (13) does not work correctly. Thus, the cascode circuit is testable. The high-density IC manufacturing process becomes applicable also for devices with a high number of high-voltage outputs. Internal potentials may be observed in a fast parallel way.

12 Claims, 6 Drawing Sheets

TESTABLE CASCODE CIRCUIT AND METHOD FOR TESTING THE SAME USING A GROUP OF SWITCHING ELEMENTS

The present invention relates to a testable cascode circuit and method for testing the same, and in particular relates to a cascode circuit which is used to switch voltages that exceed the maximum operating voltage for transistors in a given manufacturing process.

In today's integrated-circuit (IC) manufacturing, process technology is used which enables a reduction size of the transistors well below sub-micron level. Consequently, the maximum source-to-drain, gate-to-drain, and gate-to-source voltages which such transistors can tolerate are likewise reduced. A typical sub-micron process uses transistors which tolerate voltages up to a few volts (e.g., up to 3 V). Although these processes have many advantages such as increased speed and density of transistors, there remains the problem that the interface between the concerned integrated circuits and the outside world may need higher voltages. As example, a thin-film-transistor (TFT) source driver uses hundreds of output pads where voltages larger than 3 V are needed.

Special IC designs are known from the prior art which allow to drive outputs to voltages which exceed the allowed maximum voltage for a single transistor. Some of these approaches are discussed in the following, with reference to the prior-art FIGS. 1-7.

The design of an IC 100 shown in FIG. 1 is based on the recognition that there are two main parts of an IC device 100 in which high voltages may be needed:

output drivers 101 (typically push-pull or open-drain outputs) arranged in front of an IC output 110, or
  level shifters 102 for creating control signals for the output drivers 101.

For these parts 101, 102 of the IC device 100 to which a high voltage is applied via high-voltage lines 104 and 105, respectively, special precautions must be made to assure that none of the transistors experiences a voltage that is higher than tolerated by the manufacturing process. The other elements of the IC, e.g., a logic part 103 to which a low voltage is applied via a low-voltage line 106, remain unchanged.

The need for a special technique is illustrated in FIG. 2. A simple push/pull output 101 connected to a ground-voltage line 19 ($V_{SS}$=0 V) and a supply-voltage line 29 (e.g., $V_{DD}$=4 V) is presented as an example. The push/pull output 101 comprises an upper (push) stage 20 with a p-channel metal-oxide-semiconductor (MOS) transistor 21, a lower (pull) stage 10 with an n-channel MOS transistor 11, and an output 110 arranged between the two stages 10, 20; the gates of the MOS transistors 11, 21 are connected to inputs. It is assumed that the push/pull output 101 should drive a voltage of 4 V. In this case, the upper p-channel MOS transistor 21 is conducting, while the lower n-channel MOS transistor 11 is not conducting. The full voltage of 4 V is now applied between source and drain of the lower n-channel MOS transistor 11. In case of a low-voltage process, where voltages up to 3 V are allowed, this is forbidden. To avoid such a high voltage at the switching n-channel MOS transistor 11 or p-channel MOS transistor 21, an additional circuitry is required.

This additional circuitry is drawn in FIG. 3 as two black boxes 12, 22. The purpose of the first black box 12 is to avoid that the potential at node B' ever exceeds the voltage allowed per transistor (e.g., 3 V). Similarly, the second black box 22 must avoid that potential at node A' is ever lower than a certain value (e.g., lower than the applied 4 V minus the allowed 3 V).

In the example of FIG. 3, there exists a symmetry between the lower stage 10 (pull; n-channel MOS transistor 11+first black box 12) and the upper stage 20 (push; p-channel MOS transistor 21+second black box 22). For an easier understanding, the following discussion deals only with the lower (pull) stage 10, but it can be applied in an analogous manner also to the upper (push) stage 20.

A special technique typically used for voltage limitation is the so-called cascoding technique. In the cascading technique, additional transistors are used to avoid that an overcritical voltage is applied at one single transistor at any given time. In a simple example shown in FIG. 4, one additional cascode transistor 13 is added in order to avoid that an overvoltage is applied to the n-channel MOS transistor 11 of the push-pull (or open-drain) output 101. The gate of the cascode transistor is connected to a bias voltage 14. It can be seen that the full voltage of 4 V is divided, whereby a first part of 2.8 V is applied to the main switching n-channel MOS transistor 11 and the remaining 1.2 V are applied to the cascode transistor 13.

Additional precautions must be met if the applied voltage is significantly higher than the voltage allowed by the manufacturing process. When the output 110 should be driven to 0 V (transient moment, see FIG. 4), another problem may arise. The n-channel MOS transistor 11 starts conducting, and therefore the voltage drop between source and drain of this n-channel MOS transistor 11 is reduced. During the transient phase of the switching, there may exist a moment when the voltage between source and drain of the cascode transistor 13 exceeds the allowed voltage from process, as shown in FIG. 5.

To protect the cascode transistor 13 itself from such a high voltage, special additional circuitry is typically added. In FIG. 6, an additional black box 15 with the following characteristics is inserted:

The voltage drop dV is about 1 V (diode voltage) if the potential at node C' is higher than the potential at node D'; and
  The voltage drop dV is about 0 V if the potential at node C' is lower than the potential at node D'.

After the manufacture of an integrated circuit, a device test is usually applied to prove that no defect exists in the device. The goal of such a test is to screen out all bad devices which either do not work according to the specification or which may fail too early in the application (life-time problem). The main problem in testing the cascode circuitries comes from the fact that they show a redundant behavior. That means that a malfunction of such a cascode circuitry may not have an impact on the function of the device. Standard tests which compare the real function of a device with the function specified in the datasheet will not see any difference. In case of an undetected defect of the cascode transistors, a significant reduction of lifetime of the device must be expected. If the advantages of the sub-micron processes should become usable for a wide range of products, it is necessary that a defect of the cascode circuitry becomes testable.

As an illustration of the testing problem, FIG. 7 shows a simple cascode circuitry 101 where one cascode transistor 13 protects the main n-channel MOS transistor 11 of a pulldown output 110 from overvoltage. A situation is discussed in which the output 110 is at 4 V and the main n-channel MOS transistor 11 is not conducting. In case of an ideal n-channel MOS transistor 11, no leakage current would flow at all. Therefore, node B' would be fully floating. This would result in any potential, e.g., 4 V. With such an ideal n-channel MOS transistor 11, the cascode circuitry 101 could not protect the n-channel MOS transistor. However, the n-channel MOS transistor 11 does have a small leakage current, e.g., 2 nA or less, even in the non-conducting state. The applied voltage at the gate of the cascode transistor 13 regulates the current between source and drain of the cascode transistor 13 to be equal. This is, however, only true if the current flowing through the cascode transistor 13 can be regulated down to such a small value; a defect in the cascode transistor 13, e.g., resulting in a current of 5 nA, already disables this regulation loop. Such a small leakage current level is difficult to detect. Nevertheless, the function of the output (seen from the output pad 110) is still the same (still at 4 V). A standard test method will not discover this defect.

Most often, only a very small number of high-voltage outputs 110 is needed per device. In such a case, it may be possible to live with a risk of reduced lifetime or to provide some additional circuitry for testing these critical nodes (e.g., node B' in FIG. 7) with a specific test mode. However, in case of more complex applications with hundreds or thousands of such cascode circuitries, a special testing approach is needed.

U.S. Pat. No. 6,211,693 (Andresen et al.) describes a test circuit for cascode circuits. It is comprised of test transistors connected to regulating transistors. This test circuit has, however, some disadvantages:

- The test circuit does not give any degree of freedom. There is always the risk that it draws current or is blind.
- Andresen et al. assume that no current is flowing in a transistor if the applied voltage is less than the threshold voltage, which is not true. This false assumption has a great effect if many, e.g., 1000, test transistors are connected.
- As many as four test transistors are needed to test one pair of cascode transistors. Thus the test circuit needs a large area on the chip.
- The test circuit works only if the additional current invoked by the test circuit is significantly higher than a background current of a high-voltage pin. Thus the test transistors must be designed large.
- Andresen et al. describe only a solution where the maximum applied voltage is less than about 150% of the maximum voltage allowed by the process.
- Andresen et al. do not describe any test circuit for a cascode circuit with two cascode elements.
- The test circuit is not testable for faults in the test circuit itself. Since it may have some faults from processing, the test results are very much interpretable.
- The test transistors are always connected to the high voltage during the application. This bears the risk of a damage of some of the test transistors.

It is therefore an object of the invention to provide a testable cascode circuit and a method for testing the same which do not suffer from the above-mentioned disadvantages.

This and other objects are solved by the invention as defined in the independent claims. Advantageous embodiments of the invention are defined in the dependent claims.

The method according to the invention is useful for testing a cascode circuit comprising an electronic element to be protected from high voltage and a cascode element connected to said electronic element. The method comprises the steps of arranging a test node between said electronic element and said cascode element, allocating a switching element to said test node and connecting said switching element to said test node, said switching element having a plurality of switching states and being constituted such that its switching state is changed when the voltage at said test node exceeds or falls below a given voltage limit, activating said cascode element, and detecting the switching state of said switching element.

The cascode circuit according to the invention comprises an electronic element to be protected from high voltage, a cascode element connected to said electronic element, a test node arranged between said electronic element and said cascode element, a switching element allocated to said test node and connected to said test node, said switching element having a plurality of switching states and being constituted such that its switching state is changed when the voltage at said test node exceeds or falls below a given voltage limit, and means for detecting the switching state of said switching element.

In a preferred embodiment, the switching element comprises a test transistor, a gate of which is connected to said test node, a source of which is connected to a first test point and a drain of which is connected to a second test point; a first voltage is applied to said first test point and a second, different voltage is applied to said second test point, and a current flow is detected between said first and said second test point. Preferably, the cascode circuit comprises a plurality of electronic elements to be protected from high voltage, a plurality of cascode elements, each cascode element being connected to an electronic element, and a group of test transistors wherein all sources of said group of test transistors are connected to said first test point and all drains of said group of test transistors are connected to said second test point.

The invention and, for comparison, the prior art are described in greater detail hereinafter relative to the attached schematic drawings.

Figure 1:
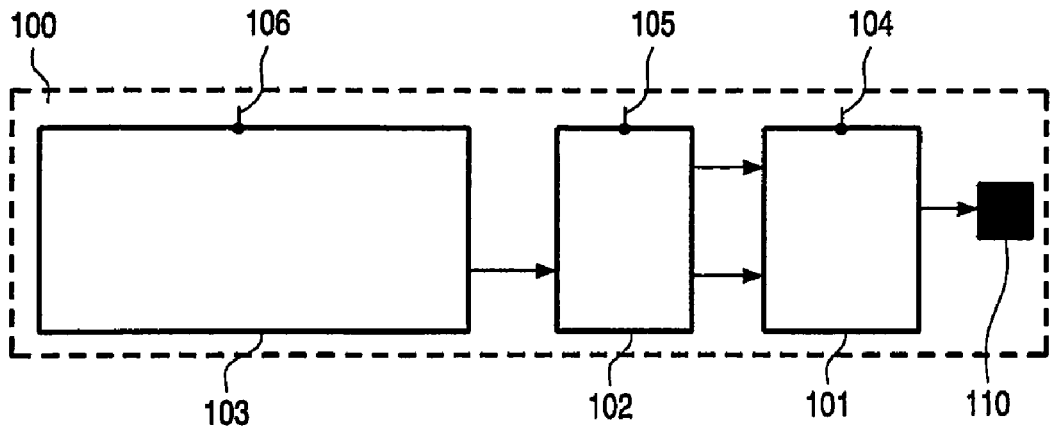
FIG. 1 shows a block diagram of a simple integrated circuit.
Figure 8:
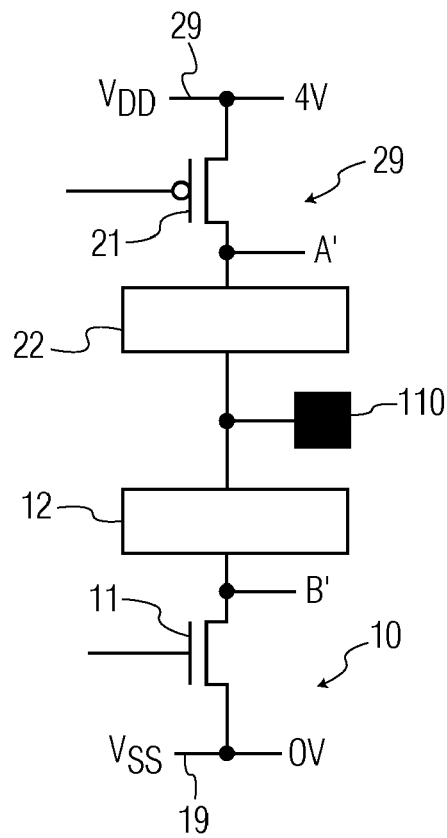
FIG. 8 shows a circuit diagram of a simple cascode circuit to which the method according to the invention may be applied.

Two different methods are proposed to test the working of the cascode circuitry:

Method A concerns all circuitry in the device where a situation as shown in FIG. 8 is given, i.e., the p-channel MOS transistor 21 is connected to the positive supply-voltage line 29 (e.g., $V_{DD}$=4 V) and the n-channel MOS transistor 11 is connected to the negative ground-voltage line ($V_{SS}$=0 V). This means that this method can be applied also to level shifters 102 (cf. FIG. 1), where the outputs are not connected to a pad 110, but rather connected only to inputs of other parts 101 of the device 100. This method A tests whether the n-channel MOS transistor 11 and p-channel MOS transistor 21 shown FIG. 8 are well protected.

Figure 2:
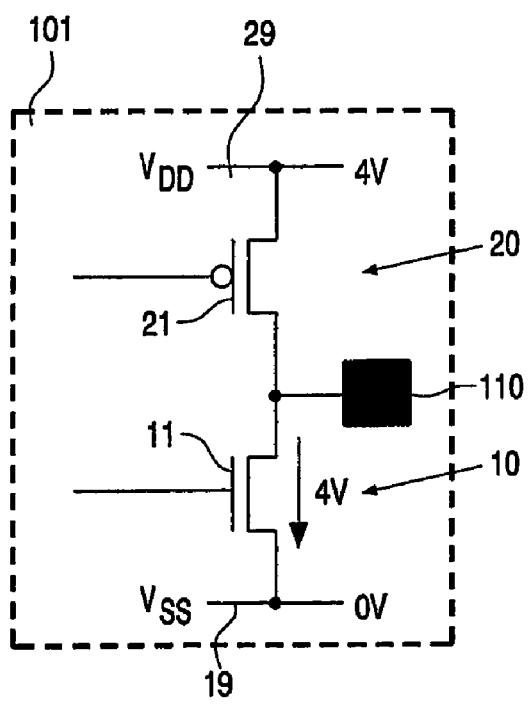
FIG. 2 shows a circuit diagram of a push/pull output according to the prior art.
Figure 3:
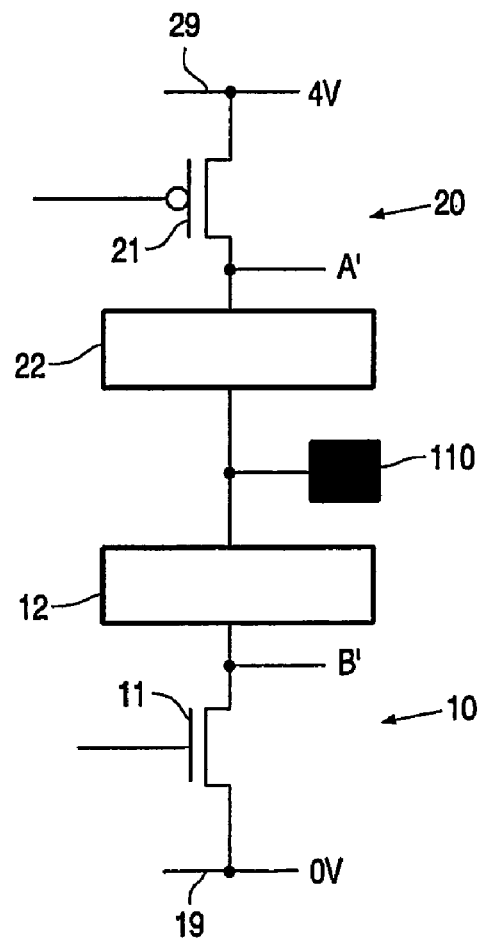
FIGS. 3 and 4 show circuit diagrams of simple cascode circuits according to the prior art.
Figure 6:
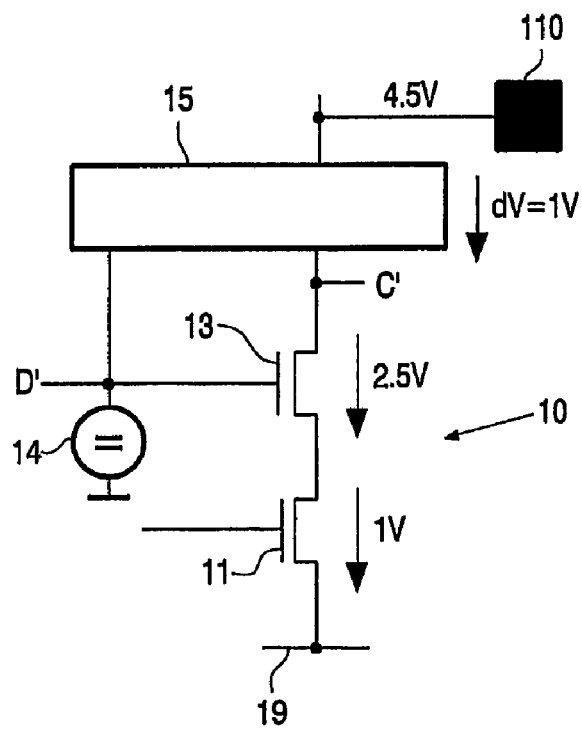

Method B is only needed if the simple cascading technique (cf. FIGS. 2-4) is not applicable, but rather the advanced cascading technique (cf. FIG. 6) is used. In this case, method B is needed to test whether the cascode circuitry itself (in case of FIG. 8, it may be part of the black boxes 12, 22) is protected from overvoltage.

Method A:

This method is based on the fact that the potential at all nodes B' (FIG. 8) in the whole device must not exceed a certain value.

Figure 4:
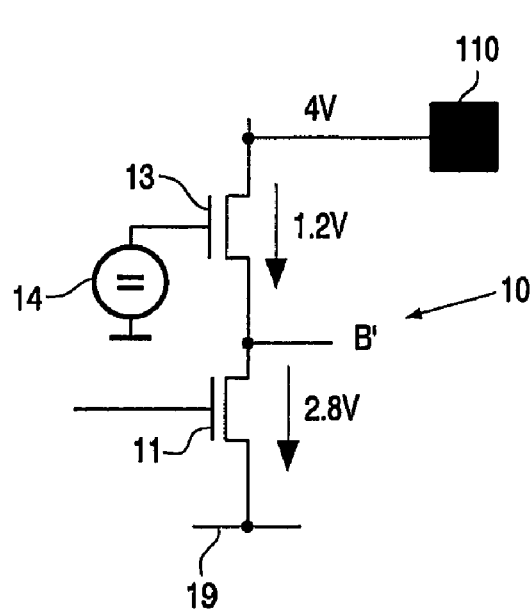
Figure 5:
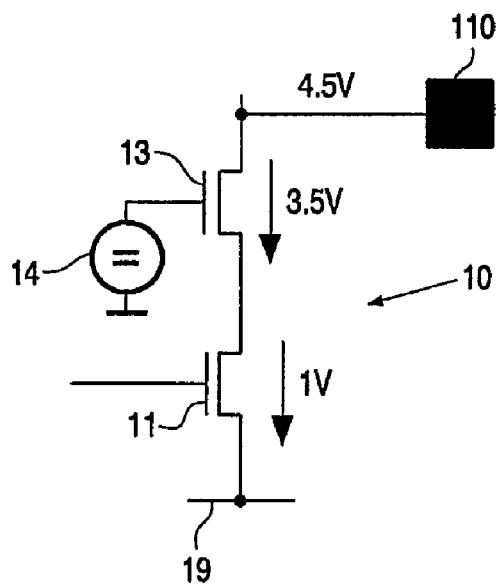
FIGS. 5 and 6 shows circuit diagrams of advanced cascode circuits according to the prior art.
Figure 7:
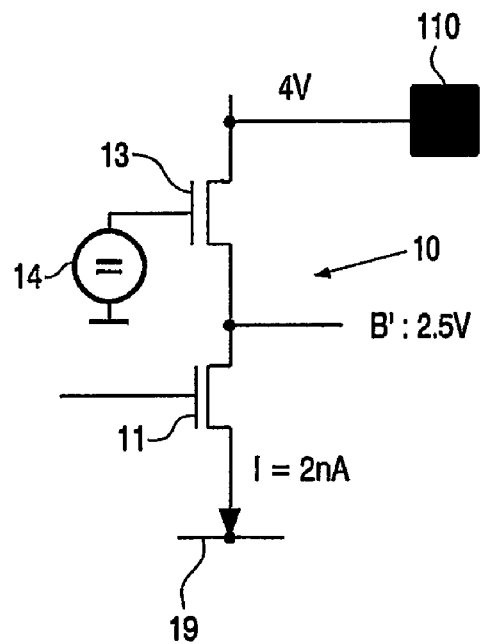
FIG. 7 shows a circuit diagram of a simple cascode circuit according to the prior art.
Figure 9:
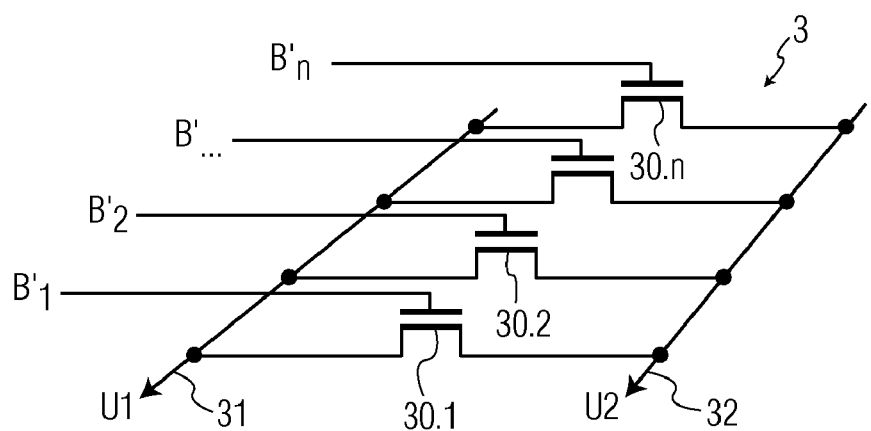
FIG. 9 shows a schematic diagram of a first embodiment of a testing circuit according to the invention.
Figure 12:
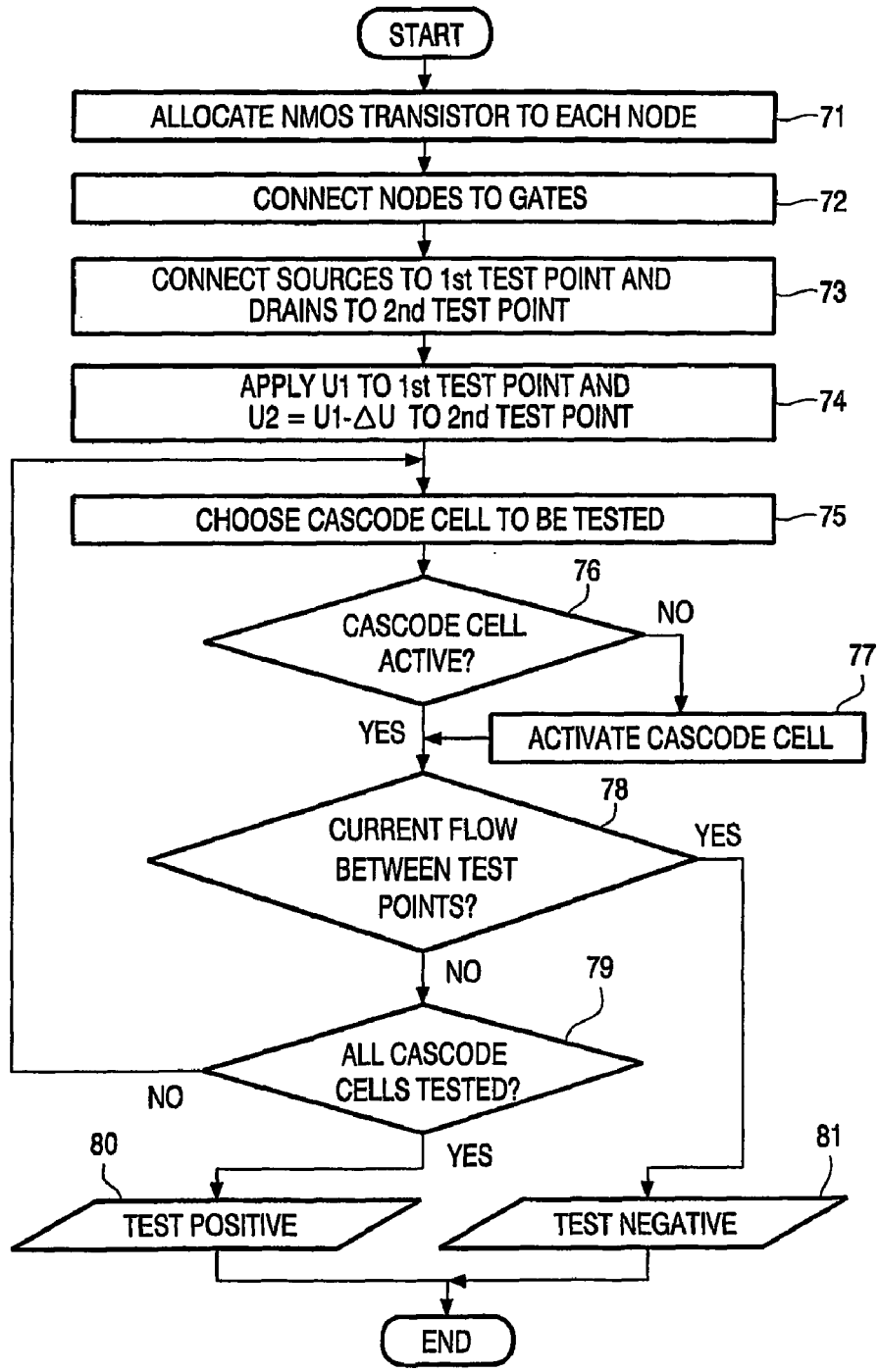
FIGS. 12 and 13 show flow diagrams of two embodiments of the method according to the invention.

FIG. 9, in combination with a simple cascode circuitry such as shown in FIG. 4 or 7, shows a circuit according to the invention; FIG. 12 shows a flow diagram of a method according to the invention. To each test node $B'_1, B'_2, \ldots, B'_n$, arranged between a switching n-channel MOS transistor 11, and a cascode cell 13 in the device, an own allocated n-channel MOS test transistor 30.1, 30.2, ..., 30.n, respectively, is allocated 71. Each test node $B'_1, B'_2, \ldots, B'_n$ is connected 72 to the gate of its allocated test transistor 30.1, 30.2, ..., 30.n, respectively. Sources and drains of the allocated n-channel MOS test transistors 30.1, 30.2, ..., 30.n are connected 73 to a first test point 31 and a second test point 32, respectively. These test points 31, 32 may be dedicated pads of the device or internal nodes in the device 100 which are connected to a pad in a special test mode only.

The test circuit 3 of FIG. 9 is like a logic OR connection of all nodes $B'_1, B'_2, \ldots, B'_n$. If all the cascode circuitries 13 in the device work correctly, then it is granted that no $B'_x$ potential in the device exceeds a certain maximum value, i.e., an upper voltage limit U1. In this case, this upper voltage limit (e.g., U1=3 V) is applied to the first test point 31, and a slightly smaller voltage (e.g., U2=U1−ΔU=3 V−100 mV) is applied to the second test point 32, as shown in box 74 of FIG. 12. Since none of the gate potentials must be higher than the upper voltage limit U1, no current is flowing between the first test point 31 and the second test point 32 if all cascode cells work correctly (box 78 in FIG. 12), and the test is positive 80. In case of a faulty cascode circuitry 13, the concerned node $B'_x$ is at a higher voltage U>U1, and therefore turns on its allocated n-channel MOS transistor 30.x. In this case, a current flow can be measured between the first test point 31 and the second test point 32 (box 78 in FIG. 12), and the test is negative 81. The voltage difference ΔU=U1−U2 is chosen so as to optimize the following parameters:

(a) A large ΔU will generate larger currents in case of a defect, and allow a low accuracy of the test equipment when measuring the current.
(b) A small ΔU will reduce the sub-threshold current of the test transistors 30.1-30.n. This may become significant if a very high number n of parallel test transistors 30.1-30.n are used.

Normally, ΔU is chosen to be in the range of 1 to 15% of the voltage limit U1, e.g., about 3%. The possibility of choosing the voltage difference ΔU is an advantage in comparison to the prior art such as described in U.S. Pat. No. 6,211,693 (Andresen et al.), since it offers an additional degree of freedom for testing the cascode circuit.

Figure 10:
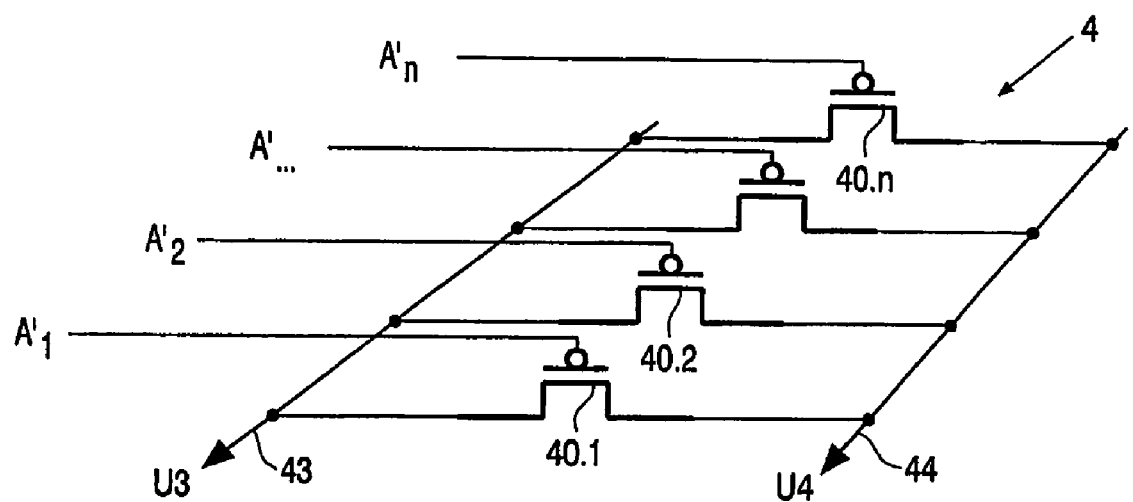
FIG. 10 shows a schematic diagram of a second embodiment of a testing circuit according to the invention.

An analogous solution can be applied for testing the working of the cascode circuitries for the p-channel MOS transistor 21 of FIG. 8. The corresponding test circuit 4 according to the invention is shown in FIG. 10. Each test node $A'_1, A'_2, \ldots, A'_n$ of FIG. 8 is connected to the gate of an allocated p-channel MOS test transistor 40. In case of a perfect functioning of the cascode circuitry 23, none of the potentials $A'_1, A'_2, \ldots, A'_n$ should be lower than a certain value U3.

To test the working of the cascode circuitries of the p-channel MOS transistors, the minimum allowed voltage, i.e., a lower voltage limit U3, for such a test node A' is applied to a third test point 43 (e.g., U3=4 V−3 V=1 V). A fourth test point 44 is forced to a similar, however slightly higher voltage (e.g., U4=U3+ΔU=1 V+100 mV). In case that all test nodes $A'_1, A'_2, \ldots, A'_n$ in the device are on a potential higher than the lower voltage limit U3, no current is flowing between the third test point 43 and the fourth test point 44. In case of a faulty cascode circuitry 23, the potential at the concerned test node $A'_x$ is lower than U3, and therefore the allocated p-channel MOS transistor 40.x is switched on, resulting in a current between the third test point 43 and the fourth test point 44. The flow diagram of FIG. 12 can be applied to this case, mutatis mutandis. The voltage differenceΔU=U4−U3 is chosen in an analogous way as described with reference to FIG. 9, so as to optimize the parameters (a) and (b). Normally, ΔU is in the range of 1 to 15% of the voltage limit U3, e.g., about 10%. The possibility of choosing the voltage difference ΔU is an advantage in comparison to the prior art such as described in U.S. Pat. No. 6,211,693 (Andresen et al.), since it offers an additional degree of freedom for testing the cascode circuit.

According to a preferred embodiment of the invention, both the n-channel MOS transistors 11 and the p-channel MOS transistors 21 of a cascode circuitry are tested. However, this is preferably done in two separate testing circuits as shown in FIGS. 9 and 10. The separation of the testing circuits has the advantage of deliberately choosing and optimizing the applied voltage differences U1−U2 and U4−U3, respectively, thus gaining an additional degree of freedom. By contrast, in U.S. Pat. No. 6,211,693 (Andresen et al.) the lines corresponding to test points 31 and 43 on the one hand and 32 and 44 on the other hand are short-circuited.

Test method A gives a good result only for those cascode circuitries which are in the active state at the moment of test. This is obvious from FIG. 8: if the output 110 is forcing 4 V, then the upper cascode circuitry 22 (protecting the p-channel MOS transistor 21) does not have anything to do. If the mentioned test is applied at this moment, the upper cascode circuitry 22 is not tested. Therefore, the test method A (for the n-channel MOS transistor 11 and the p-channel MOS transistor 21) should be applied at least twice: once when the outputs 110 are driving a high voltage and a second time when the outputs 110 are driving a low voltage. For a correct working of test method A, it is not important that all the outputs 110 are driving the same state at the same moment. The test should be repeated with different states of the logic 103 of the device 100 (cf. FIG. 1), as often as each output 110 has been tested at least once per n-channel MOS transistor 11 and once per p-channel MOS transistor 21 when its cascode cell is active; cf. boxes 75-77 and 79 of FIG. 12. This is preferably achieved by an appropriate programming of the test process.

To protect the additional transistors 30.1-30.n, 40.1-40.n from high voltage themselves, an uncritical potential (e.g., 2.5 V) is applied to the first 31, second 32, third 43 and fourth 44 test point during the application. This avoids that the gate-to-source or gate-to-drain voltage in any of the additional transistors 30.1-30.n, 40.1-40.n exceeds the voltage limit given by the process.

The schematic flow diagram of FIG. 12 combines steps which, in practice, may be carried out at different stages of the method according to the invention. In a preferred embodiment of the method, a first stage refers to designing the test circuit and comprises boxes 71-73 of FIG. 12. A second stage refers to programming the test process and comprises boxes 75-77 of FIG. 12. Finally, a third stage refers to the test process itself and comprises boxes 74 and 78-81 of FIG. 12.

Figure 11:
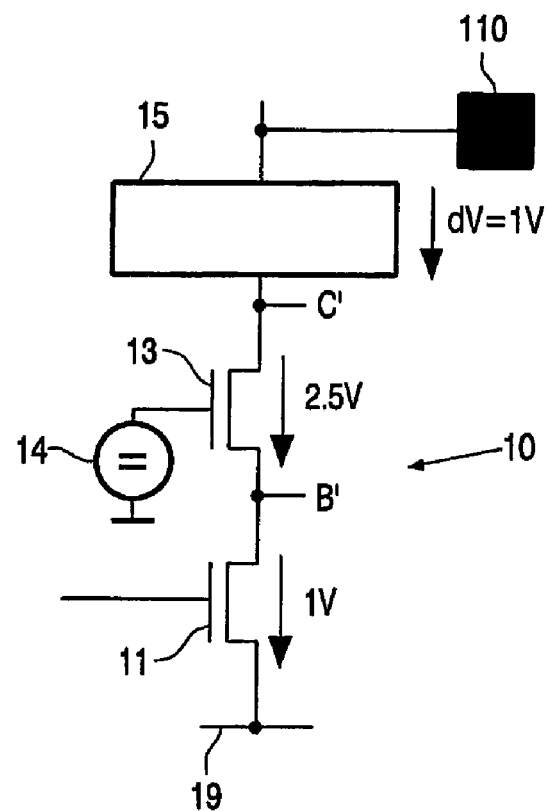
FIG. 11 shows a circuit diagram of an advanced cascode circuit to which the method according to the invention may be applied.
Figure 13:
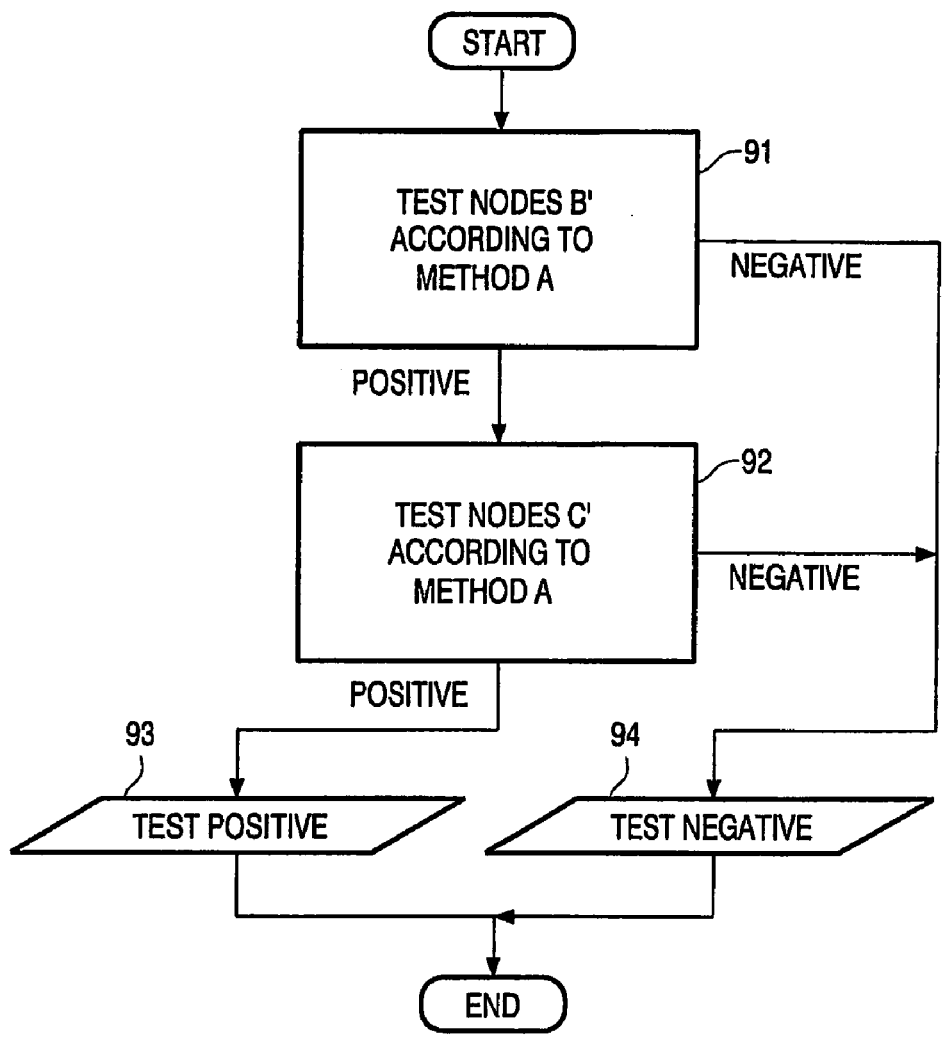

Method B:

Method A described above with reference to FIG. 12 is valid under the condition that the voltage across one of the black boxes 12, 22 in FIG. 8 never exceeds the maximum allowed voltage per transistor. If this is not true, then an advanced cascoding technique is typically used, as shown in FIG. 11 and explained above (cf. FIG. 6). In this case, method B schematically shown in FIG. 13 should be used for testing.

According to method B, two different items are proven during the test:

(i) No overvoltage ever exists on the n-channel MOS transistor 11, i.e., the potential at node B' must never exceed a certain value. This problem can be solved in the same way as in method A described above; cf. box 91 of FIG. 13.

(ii) No overvoltage ever exists over the cascode transistor 13. Therefore, some additional circuitry is needed for testing. The invention takes advantage of the fact that node C' must never be above a certain potential. That means that the same technique can be applied as in method A for the n-channel MOS transistors 11 (cf. box 92 of FIG. 13): each of the nodes C' in the device is connected to the gate of an allocated n-channel MOS transistor, the sources and drains of which are connected to a fifth test point and a sixth test point, respectively. (It is not necessary to show a drawing of the corresponding additional testing circuitry since it is completely analogous to that of FIG. 9.)

Only if both items (i) and (ii) yield a positive result, the test is positive 93; otherwise, the test is negative 94.

It is usually not necessary to test for an overvoltage over the black box 15 itself, because such an overvoltage would usually also have an impact on the standard function of the cell and would therefore be detectable via standard test methods. A defect in the black box 15 has the result that either the voltage drop over the black box 15 is too low, and therefore is detected via the test method over node C' explained above, or the voltage drop over the black box 15 is too large, and therefore detectable during a conventional function test.

Thanks to the invention, the high-density IC manufacturing process becomes applicable also for devices with a high number of high-voltage outputs 110. Internal potentials may be observed in a fast parallel way. The invention not only allows to test a cascode circuit for the alternative pass/fail, but also a measurement of internal potentials. Compared to the prior art such as described in U.S. Pat. No. 6,211,693 (Andresen et al.), it offers great degree of freedom in measuring the internal potentials. Admittedly, a certain additional silicon area is needed for the implementation of the additional transistors 30.1-30.$n$, 40.1-40.$n$; however, this disadvantage is compensated by the benefits offered by the invention.

The invention claimed is:

1. A method for testing a cascode circuit including a plurality of electronic elements to be protected from high voltage and a plurality of cascode elements connected to said electronic elements, the method comprising the steps of:

arranging a plurality of test nodes between each electronic element and each cascode element;

for each test node, allocating a different switching element and connecting said switching element thereto, each switching element having a plurality of switching states that are changed when the voltage at a connected test node, in the plurality of test nodes, exceeds or falls below a given voltage limit;

connecting each test node to a first test line and a second test line, the first test line indicating whether the switching state of at least one switching element from the switching elements is in a changed switching state;

applying a first voltage to the first test line and a second voltage to the second test line;

activating at least one cascode element using an activation circuit; and detecting, in response to the step of activating, the switching state of at least one switching element using a detection circuit and, therein, indicating whether the cascade circuit tests positively or negatively.

2. The method according to claim 1, wherein said voltage limit is either chosen to be an upper voltage limit applicable to an electronic element if said electronic element is connected to a ground-voltage line, or is chosen to be a supply voltage minus an upper voltage limit applicable to the electronic element if said electronic element is connected to a supply-voltage line.

3. The method according to claim 1, wherein each switching element is chosen to include a group of test transistors, for each test transistor of the group of test transistors, a gate of said test transistor is connected to said test node, a source of said test transistor is connected to the first test line and a drain of said test transistor is connected to the second test line, the first voltage is applied to said first test line, the second, different voltage is applied to said second test line, and a current flow is detected between said first and said second test lines.

4. The method according to claim 3, wherein said detection of a current flow is used for testing a correct or an incorrect working of said cascode circuit, or for determining a voltage on said test node.

5. The method according to claim 3, wherein said first voltage is either chosen to be an upper voltage limit applicable to an electronic element if said electronic element is connected to a ground-voltage line, or is chosen to be a supply voltage minus an upper voltage limit applicable to said electronic element if said electronic element is connected to a supply-voltage line, and, in both cases, said second voltage is chosen to slightly differ, by 1 to 15%, from said first voltage.

6. The method according to claim 3, wherein said electronic elements include an MOS field effect transistor of a first channel conduction type, and said test transistors are chosen to be an MOS field effect transistor of the same first channel conduction type.

7. The method according to claim 3, wherein all sources of said test transistors are connected to said first test point and all drains of said test transistors are connected to said second test point.

8. The method according to claim 1, wherein each cascode element is consecutively activated.

9. A cascode circuit comprising:

a plurality of electronic elements to be protected from high voltage;

a plurality of cascode elements connected to said electronic elements;

a plurality of test nodes arranged between said electronic elements and said cascode elements;

a first test line configured to receive a first selected voltage;

a second test line configured to receive a second selected voltage;

a plurality of switching elements allocated to said test nodes and connected to said test nodes, said switching elements having a plurality of switching states that are changed when the voltage at said test node exceeds or falls below a given voltage limit, wherein one switching state represents a connection between the first test line and the second test line and another switching state represents a lack of a connection between the first test line and the second test line; and a detection circuit for detecting the switching state of said switching element;

wherein the switching elements are connected by at least one test line so that the electric signal on said at least one test line indicates whether the switching state of at least one switching element from said switching elements is in a changed switching state.

10. The cascode circuit according to claim 9, wherein said switching elements include
a group of test transistors, for each test transistor of the group of test transistors,
a gate of said test transistor being connected to said test node,
a source of said test transistor being connected to a first test point and
a drain of said test transistor being connected to a second test point, and
the cascode circuit further comprises circuitry for applying a first voltage to said first test point for applying a second, different voltage to said second test point, and for detecting a current flow between said first and said second test points.

11. The cascode circuit according to claim 9, wherein said electronic elements include an MOS field effect transistor of a first channel conduction type, and said test transistor is an MOS field effect transistor of the same first channel conduction type.

12. The cascode circuit according to claim 10, wherein all sources of said group of test transistors are connected to said first test point and all drains of said group of test transistors are connected to said second test point.

* * * * *